United States Patent [19]
Yu et al.

[11] Patent Number: 6,090,633
[45] Date of Patent: Jul. 18, 2000

[54] MULTIPLE-PLANE PAIR THIN-FILM STRUCTURE AND PROCESS OF MANUFACTURE

[75] Inventors: Roy Yu, Poughkeepsie; Chandrika Prasad; John R. Pennacchia, both of Wappingers Falls; Harvey C. Hamel, Poughkeepsie, all of N.Y.

[73] Assignee: International Business Machines Corporation, Armonk, N.Y.

[21] Appl. No.: 09/401,098

[22] Filed: Sep. 22, 1999

[51] Int. Cl.$^7$ .......................... H01L 23/02; H01L 23/12; H01L 23/053; H01L 29/40; G01R 21/66

[52] U.S. Cl. ..................... 438/15; 438/109; 438/624; 257/686; 257/700; 257/759

[58] Field of Search ..................... 257/686, 700, 257/759; 438/15, 109, 624, FOR 101, FOR 368, FOR 375

[56] References Cited

U.S. PATENT DOCUMENTS

| | | |
|---|---|---|
| 4,812,191 | 3/1989 | Ho et al. . |
| 4,914,814 | 4/1990 | Behun et al. . |
| 5,056,215 | 10/1991 | Blanton . |
| 5,060,844 | 10/1991 | Behun et al. . |
| 5,116,459 | 5/1992 | Kordus et al. . |
| 5,154,341 | 10/1992 | Melton et al. . |
| 5,170,931 | 12/1992 | Desai et al. . |
| 5,258,236 | 11/1993 | Arjavalingam et al. . |
| 5,306,872 | 4/1994 | Kordus et al. . |
| 5,338,900 | 8/1994 | Schneider et al. . |
| 5,342,713 | 8/1994 | Ohtsuka et al. . |
| 5,347,162 | 9/1994 | Pasch . |
| 5,368,963 | 11/1994 | Hanyu et al. . |
| 5,409,157 | 4/1995 | Nagesh et al. . |
| 5,427,876 | 6/1995 | Miyazaki et al. . |
| 5,464,712 | 11/1995 | Han . |
| 5,521,032 | 5/1996 | Imai et al. . |
| 5,534,094 | 7/1996 | Arjavalingam et al. . |
| 5,534,466 | 7/1996 | Perfecto et al. . |
| 5,565,286 | 10/1996 | Lin . |
| 5,633,535 | 5/1997 | Chao et al. . |
| 5,700,715 | 12/1997 | Pasch . |
| 5,861,666 | 1/1999 | Bellaar . |
| 5,994,168 | 11/1999 | Yoshimi . |

FOREIGN PATENT DOCUMENTS

| | | |
|---|---|---|
| 2-34854 | 2/1990 | Japan . |
| 5-61181 | 3/1993 | Japan . |
| 5-142749 | 6/1993 | Japan . |
| 2 293 026 | 3/1996 | United Kingdom . |

OTHER PUBLICATIONS

Narayan et al., "Thin Film Transfer Process for Low Cost MCM–D Fabrication," Date not available.

Microelectronics Packaging Handbook by R. Tummala et al. Date not available.

*Primary Examiner*—David E. Graybill
*Attorney, Agent, or Firm*—Ratner & Prestia; Ira D. Blecker

[57] ABSTRACT

A multiple plane pair thin-film structure and a process for the manufacture of that structure. The multiple plane pair thin-film structure is of modular design and manufacture, such that each module comprising the structure is manufactured and tested individually before assembly. The thin film wiring structure is comprised of a plurality of true plane pair thin-film structures. Each such plane pair thin-film structure is manufactured as a module, the functionality of which can be tested for conformity to applicable specifications. Each module is designed and fabricated as a plane pair thin-film structure.

15 Claims, 12 Drawing Sheets

MULTIPLE-PLANE PAIR THIN-FILM STRUCTURE AND PROCESS OF MANUFACTURE

TECHNICAL FIELD

The present invention relates generally to thin-film structures that are used in electronic packaging to interconnect integrated circuit devices and various portions of such devices. In particular, the present invention relates to integrated circuit devices used in high-end servers.

BACKGROUND OF THE INVENTION

In recent years, the computer industry has experienced extremely rapid growth in all aspects, including the number of units produced, breadth of applications, power and speed of operation, and complexity of computing machines. The last aspect has created significant challenges for designers and developers of the integrated circuit devices that lie at the heart of a computing machine. Each such device must be able to complete more tasks, of increasing complexity, in a smaller volume. These demands have led to the marriage of large scale integrated (LSI) devices, each containing thousands of transistors and other functional elements, with interconnecting wiring structures that are built into the packages for the LSI devices.

The wiring structures must provide three types of electrical connections. They must connect functional elements within an LSI device, where the physical locations of those elements and the topology of the various connections preclude the possibility of accomplishing the connection within the LSI device itself They must also provide connections between two or more LSI devices that are built into a single functional device. They must also connect an LSI device to other devices used in a computer, such as circuit boards and other LSI devices.

The increasing complexity and size of LSI devices used in high-end servers has placed similar requirements on wiring structures; they have become larger and more complex. As the size of the wiring structures has increased, so has the probability that any particular wiring structure might contain a manufacturing defect that would either require repair or render the wiring structure useless. The goal of achieving a cost-effective yield of acceptable parts has become a significant issue in the manufacture of such devices.

Figure 1:
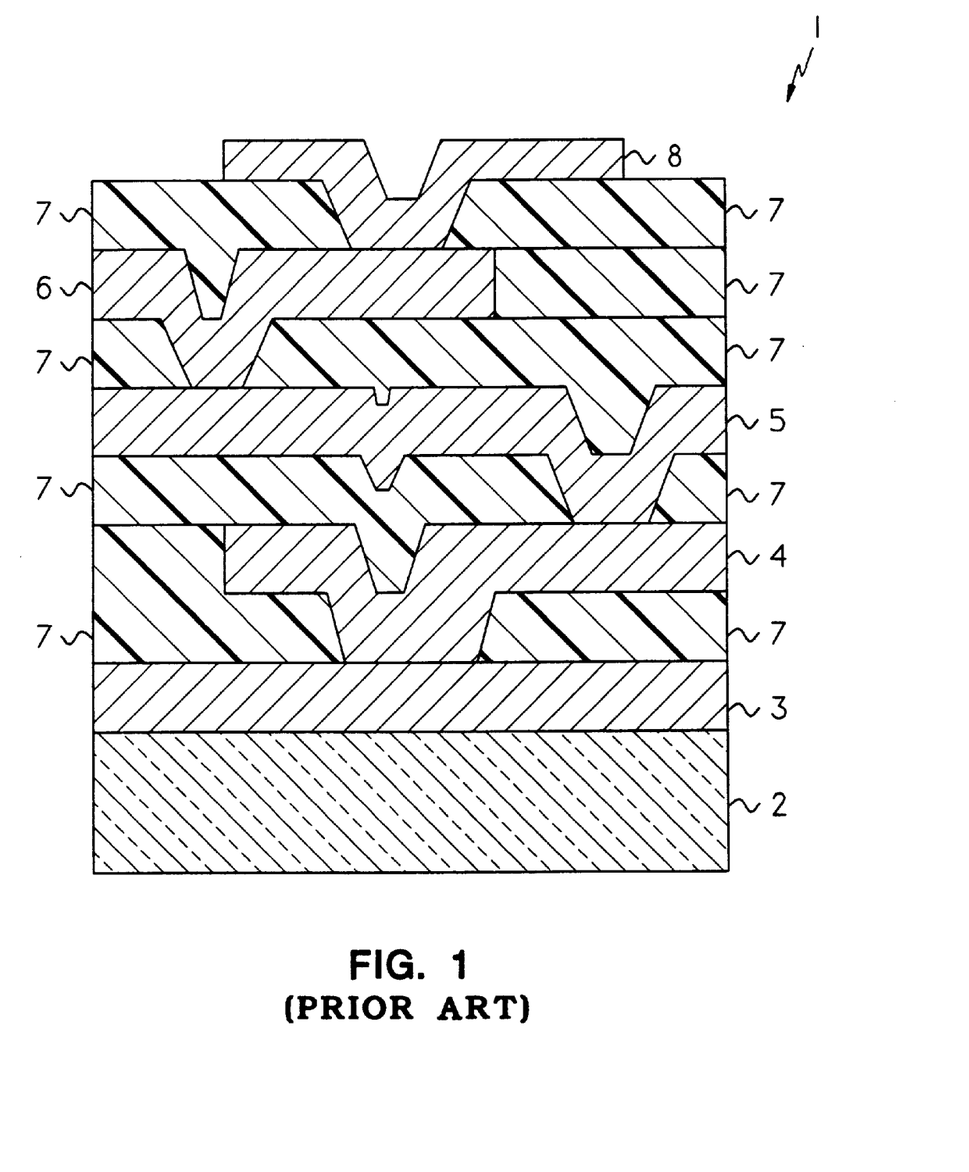
FIG. 1 illustrates, in schematic form, a cross section through a conventional plane pair thin-film structure.

A particular form of thin film wiring structure, termed a "plane pair" thin-film structure, has achieved widespread usage in the industry, for it affords considerable design flexibility and reasonable manufacturing costs and yield. FIG. 1 illustrates a conventional plane pair thin-film structure in cross section. See *Microelectronics Packaging Handbook*, page 697 (edited by R. Tummala & E. Rymaszewski eds., published by Van Nostrand Reinhold, 1989). The plane pair thin-film structure 1 begins with a silicon or ceramic substrate 2. The structure then comprises four electrically conducting layers separated from each other by (typically polyimide) insulating layers 7. In order, the conducting layers comprise a ground or reference plane layer 3, a "y" wiring or signal layer 4, an "x" wiring or signal layer 5, and a second reference plane layer 6. A top surface metallization or terminal metal 8 is provided on top of plane pair thin-film structure 1. The reference plane layers 3, 6, which may be mesh-like in configuration, serve important electrical functions including shielding, controlling signal parameters, and distributing power and ground potentials to various parts of the LSI device. The signal layers 4, 5 are comprised of a large number of parallel ribbons that carry the signals representing the functionality of the LSI device.

Plane pair thin-film structure 1 shown in FIG. 1 is typically constructed by fabricating each layer, in sequence, starting with substrate 2. Connections between adjacent conducting layers are achieved by connectors that pass through holes in the intervening insulating layer; these connectors are termed "vias." Where appropriate, a section of a conducting layer may be electrically isolated from the remainder of the layer to facilitate connection of vias between nonadjacent conducting layers. Additional insulating layers outside the reference plane layers are typically included in the design of a plane pair thin-film structure.

Figure 2:
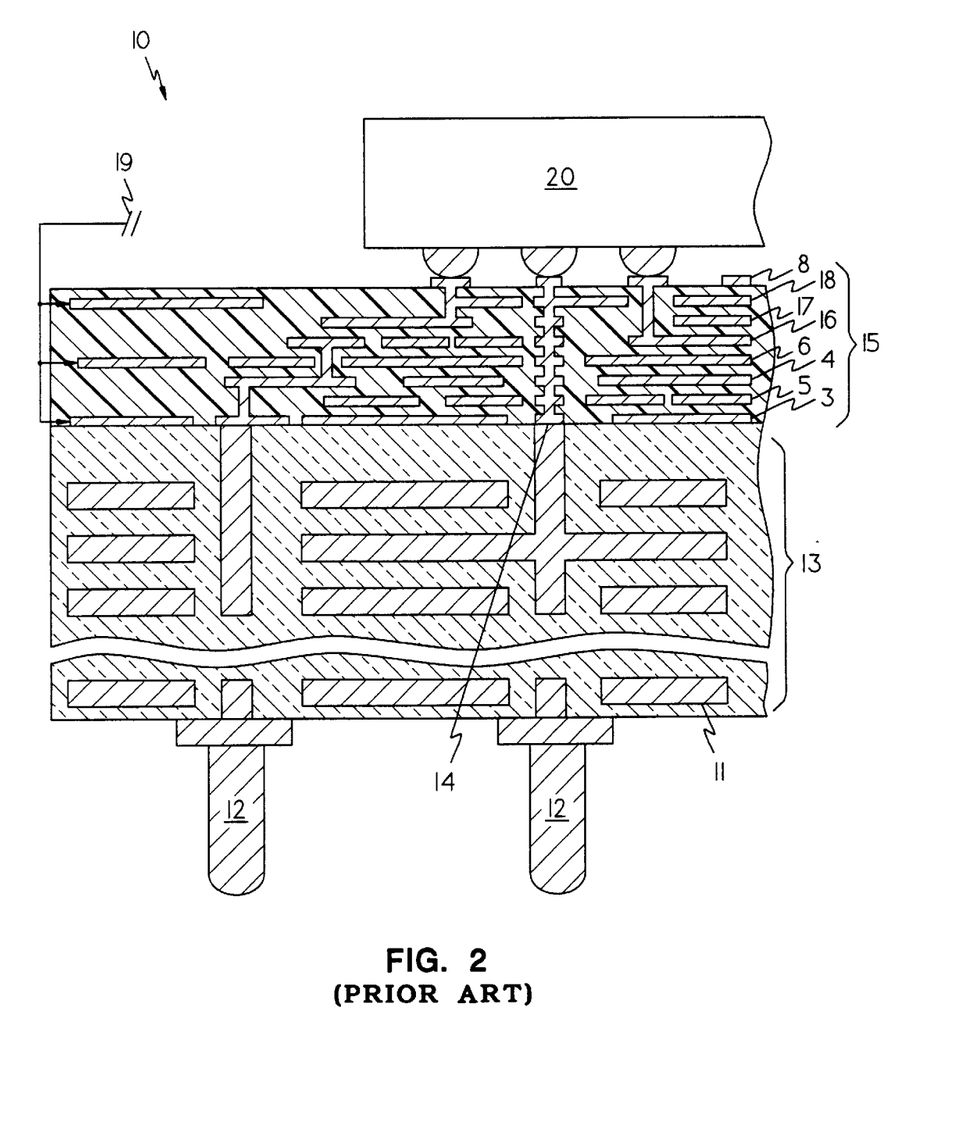
FIG. 2 illustrates, in schematic form, a cross section through a conventional multiple-plane pair thin-film structure.

The increasing complexity of wiring structures has led to stacking additional insulating and conducting layers on top of a plane pair thin-film structure, just to achieve the required number of electrical connections within the topological constraints of the physical locations of the elements being connected. Such a structure meets the requirements of certain applications for higher wiring density to interconnect semiconductor chips. FIG. 2 illustrates a cross section through a conventional multiple-plane pair thin-film structure 10. See "Multilevel Thin-Film Package in Use NEC-SX3," NEC Corporation (Japan) (April 1990). Essentially, a second plane pair thin-film structure is formed in serial fashion on top of a first plane pair thin-film structure.

More specifically, a ceramic base substrate 11 with power and ground planes 13 is provided. Input-output pins 12 extend from substrate 11. Over the connection point 14 is formed the two plane pair structure 15. In sequential order, two plane pair structure 15 comprises a ground or reference plane layer 3, an "x" wiring or signal layer 5, a "y" wiring or signal layer 4, a second reference plane layer 6, a second "x" wiring or signal layer 16, a second "y" wiring or signal layer 17, and a third reference plane layer 18. A terminal metal 8 is provided on top of two plane pair structure 15. Also illustrated in FIG. 2 are a flip tab carrier 18 and ground 19.

Two plane pair structure 15 has a number of disadvantages. First, the problem of achieving a cost-effective yield with such stacked wiring structures is more severe than for single plane pair thin-film structures. Because all of the layers are built sequentially, even one defect in one layer renders the entire structure electrically defective. Most defects occur in the signal layers and, because the four signal layers are built sequentially, the over-all yield of the manufacturing process tends to be low. This yield problem is exacerbated if six or more signal layers are required for the interconnection density.

The sequential construction of the various layers also causes a second disadvantage of two plane pair structure 15: the total manufacturing cycle time is long. In fact, the cycle time is practically not economical. Finally, the conventional two plane pair structure 15 does not allow reference planes with different potential to be adjacent. This disadvantage precludes two plane pair structure 15 from having efficient low inductance paths to decoupling capacitors.

Some of the methods used to produce thin-film structures are taught in U.S. Pat. Nos. 5,258,236, No. 5,534,094, and No. 5,534,466. All three of these patents are assigned to the assignee of the present invention. The teachings of these three patents are incorporated in this application by reference.

Titled "Multilayer Thin Film Structure And Parallel Processing Method For Fabricating Same," U.S. Pat. No. 5,258, 236 discloses a method and apparatus for releasing a workpiece from a substrate. The method includes providing a substrate which is transparent to a predetermined wavelength of electromagnetic radiation; forming, on the substrate, a separation layer which degrades in response to the predetermined radiation; providing the workpiece on the separation layer; and directing the predetermined radiation at the separation layer through the transparent substrate so as to degrade the separation layer and to separate the workpiece from the substrate.

The application that issued as U.S. Pat. No. 5,534,094 is a continuation of U.S. patent application Ser. No. 08/080, 085, filed one Jun. 21, 1993 and later abandoned, which is a divisional of the application (Ser. No. 07/695,368, filed May 3, 1991) that issued as U.S. Pat. No. 5,258,236. The subject matter disclosed by the '094 patent is essentially the same as that disclosed in the '236 patent.

U.S. Pat. No. 5,534,466 is titled "Method Of Making Area Direct Transfer Multilayer Thin Film Structure." The '466 patent discloses a process for transferring a thin film wiring layer to a substrate in the construction of multilayer chip modules. The process initially provides a sacrificial release layer formed on a surface of a carrier. Directly on the release layer there is formed in inverted fashion a plurality of multilevel thin-film structures having at least one wiring path of metallic material exposed on the surface opposite the carrier. An electronic packaging substrate is provided, and solder or other joining material is applied to one or both of the exposed metallic surfaces of the multilevel thin-film structure or the substrate. The multilevel thin-film structure is then joined to the substrate so that the attached carrier is remote from the substrate. The release layer is subsequently contacted with an etchant for the release layer so as to remove the carrier from the multilevel thin-film structure to produce a multilayer chip module.

Of course, other patents exist that teach methods used to produce thin-film structures. U.S. Pat. No. 4,812,191 is titled "Method Of Forming A Multilevel Interconnection Device." The '191 patent discloses a method of fabricating a high density electrical interconnection member by forming a composite interconnection from metallic conductors on cured liquid polymer resin on a substrate. The resin is cured at an elevated temperature to form a solid dielectric layer. Successive metallic and dielectric layers form an interconnection subassembly with the coefficient of thermal expansion of the substrate being less than the subassembly. The temperature of the subassembly is lowered placing it in tension. A support member is adhered to the exposed surface of the subassembly and the substrate is removed. Multiple subassemblies can be joined together physically and electrically to form a complex device for interconnecting a plurality of integrated circuit chips for high performance computer applications.

The deficiencies of the conventional methods used to produce multilayer thin-film structures show that a need still exists for an improved process of manufacture. To overcome the shortcomings of the conventional methods, a new process is provided. An object of the present invention to provide an improved thin-film structure that can be produced economically with a high yield of acceptable structures. It is also an object of the present invention to provide a thin film wiring structure that can accommodate the design requirements of high-end servers, applications for which prior art structures are inadequate. It is another object of the present invention to provide a multiple-plane pair thin-film structure that is manufactured in modular fashion, such that each module can be tested for conformity to applicable specifications before assembly into the complete structure.

It is a further object of the present invention to provide a process, for manufacturing such multiple-plane pair thin-film structures, characterized by higher yield of acceptable products than conventional methods. It is yet another object of the present invention to provide a process for manufacturing such multiple-plane pair thin-film structures such that the time required to complete the manufacturing process is less than that required by prior art methods. Still other objects and advantages of the present invention will be apparent from the description of the invention provided in this specification.

SUMMARY OF THE INVENTION

To achieve these and other objects, and in view of its purposes, the present invention provides a multiple-plane pair thin-film structure and a process for the manufacture of that structure. In particular, the present invention provides a multiple-plane pair thin-film structure of modular design and manufacture, such that each module comprising the structure is manufactured and tested individually before assembly. More specifically, the present invention provides a thin film wiring structure that is comprised of a plurality of true plane pair thin-film structures. Each such plane pair thin-film structure is manufactured as a module, the functionality of which can be tested for conformity to applicable specifications. Although two or more such different modules are used to manufacture a multiple-plane pair thin-film structure, each can be readily manufactured by known methods. Unlike the conventional structure illustrated in FIG. 2, each module used in the present invention is designed and fabricated as a plane pair thin-film structure to facilitate testing and to maximize design flexibility within the multiple-plane pair thin-film structure.

The present invention also provides for joining two or more plane pair modules to comprise the multiple-plane pair thin-film structure. A process of joining by soldering joining pads on one module to corresponding joining pads on an adjacent module accomplishes two purposes: it secures the two modules to each other, and it makes electrical connections between the joining pads which are electrically connected to elements within each plane pair thin-film structure. A preferred method of joining is also described.

Because each of the modules comprising the multiple-plane pair thin-film structure is tested for conformity to applicable physical, dimensional, and electrical specifications before assembly, it is possible to identify and discard (or rework) defective modules. Thus, the multiple-plane pair thin-film structure is assembled from modules known to be acceptable. In contrast, the conventional multiple-plane pair thin-film structure shown in FIG. 2 must be fully fabricated before it can be tested for conformity to specifications.

Soldering is known by those skilled in the art to be effective for this sort of joining; acceptable modules can be joined to each other with little risk of damage. The process of the present invention provides for the manufacture of the different modules in parallel, rather than in sequence as is necessary in the conventional structure shown in FIG. 2. Thus, the start-to-finish time required to manufacture the completed product is reduced. Also, as indicated above, only modules known to be acceptable are carried forward in the manufacturing process of the present invention. Subsequent manufacturing operations represent little risk of producing unacceptable results, so very high process yields are expected. In contrast, manufacturing operations to fabricate the third and fourth signal layers of the conventional structure shown in FIG. 2 must be performed without knowing whether the first and second signal layers are acceptable. Should there be a defect in the first or second layer, the time and expense to fabricate the third and fourth signal layers would be wasted. Conversely, a defect in the third or fourth signal layer could ruin otherwise acceptable first and second signal layers.

It is to be understood that the foregoing summary and the following detailed description of the invention are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not drawn to scale. On the contrary, the dimensions of the various features shown in the drawing have been arbitrarily expanded or contracted for clarity. Included in the drawing are the following figures.

DETAILED DESCRIPTION OF THE INVENTION

Figure 3:
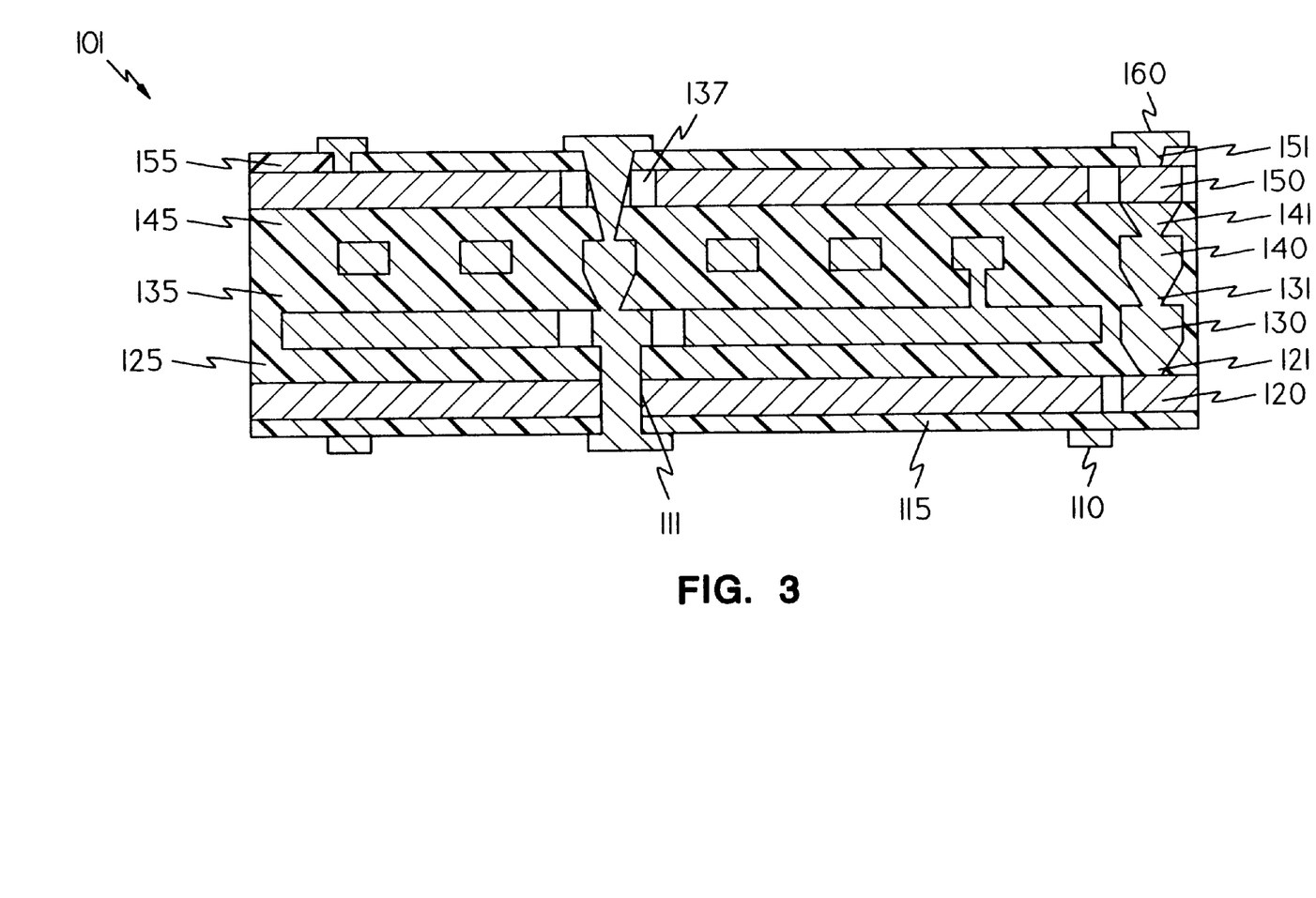
FIG. 3 illustrates, in schematic form, a cross section through a plane pair thin-film structure of the present invention.

Referring now to the drawing, in which like reference numbers refer to like elements throughout, FIG. 3 illustrates a plane pair thin-film structure used in the present invention. It may be termed a one plane pair thin-film structure, or "1PP." The structure, which can be used as a module in the present invention, is shown generally at 101. From the bottom toward the top of FIG. 3, the structure is comprised of an insulating layer 115, a reference conducting layer 120, an insulating layer 125, a "y" signal layer 130, an insulating layer 135, an "x" signal layer 140, an insulating layer 145, a reference conducting layer 150, and an insulating layer 155. Joining pads 110 and 160 are provided to connect plane pair thin-film structure 101 to other such structures, to a substrate, or to LSI chips. A number of vias 111, 121, 131, 141, and 151 provide electrical interconnection between the different conducting layers 120, 130, 140, and 150, and connections to joining pads 110 and 160. Vias 111, 121, 131, 141, and 151 pass through holes in the insulating layers 115, 125, 135, 145, and 155 and may be termed through-vias. The "y" signal layer 130 is comprised of conducting strips oriented to carry current in a generally left-right direction relative to FIG. 3; the "x" signal layer 140 is comprised of conducting strips to carry current in a direction generally perpendicular to FIG. 3. Any of the conductive layers may be interrupted to provide for a via 137 that bypasses that layer.

The preferred materials used in plane pair thin-film structure 101 are: copper for the conducting layers 120, 130, 140, and 150, the vias 111, 121, 131, 141, and 151, and the joining pads 110 and 160; and polyimide or epoxy polymer for the insulating layers 115, 125, 135, 145, and 155. Other materials that provide the requisite electrical properties and are amenable to customarily used fabrication techniques may be substituted as desired.

The preferred thickness of the insulating layers 115, 125, 135, 145, and 155 is between about 5 and about 25 microns. The preferred thickness of the conducting layers 120, 130, 140, and 150 and the joining pads 110 and 160 is between about 2 and about 25 microns. The preferred size of the joining pads 110 and 160 is between about 50 to 500 microns (0.002 to 0.020 inches), and the joining pads 110 and 160 preferably have a center-to-center spacing between about 100 and 1,000 microns (0.004 and 0.040 inches).

Figure 4:
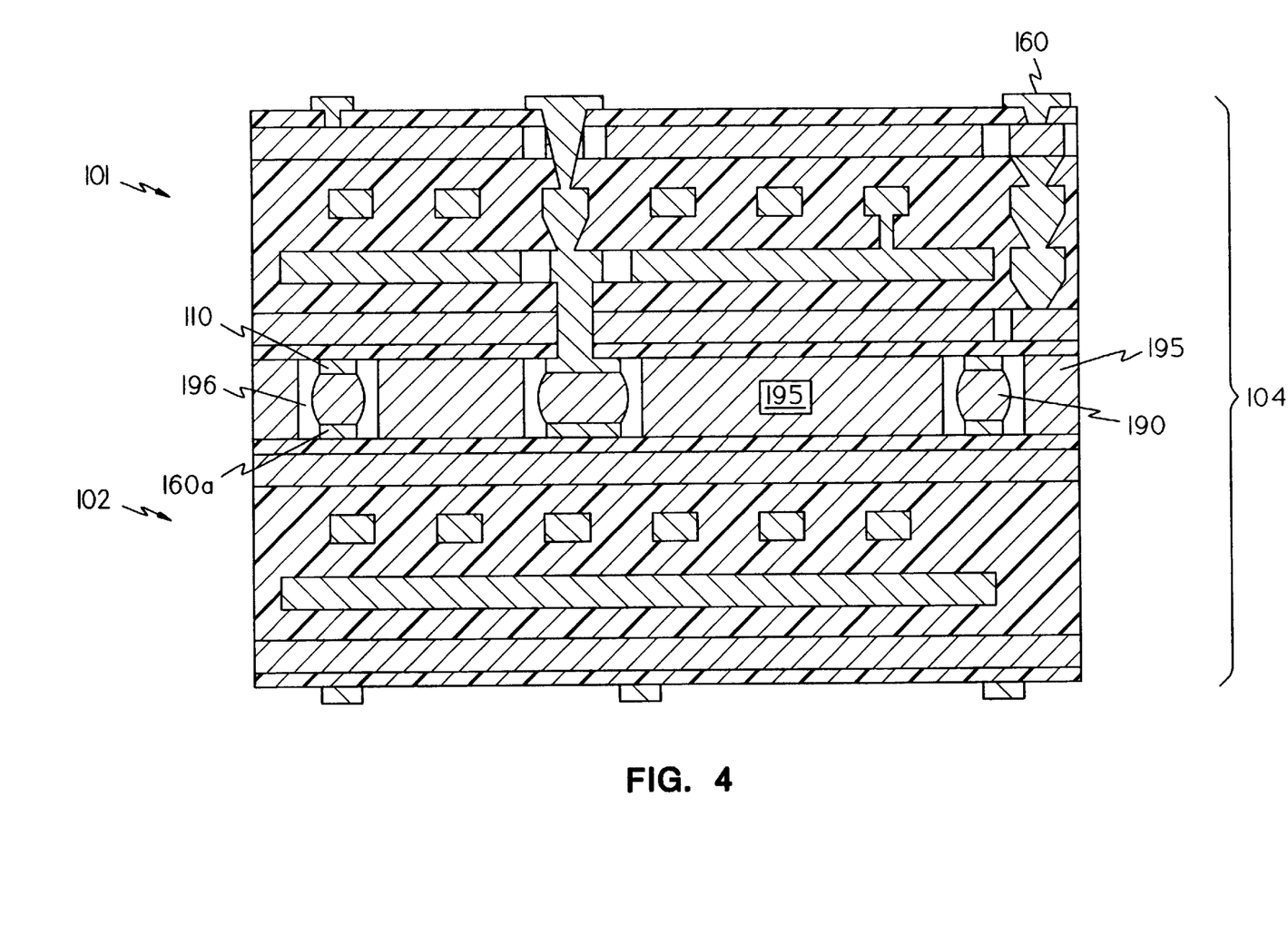
FIG. 4 illustrates, in schematic form, a cross section through a two plane pair thin-film structure of the present invention, highlighting the joining of the two plane pair thin-film structures.

The joining of two, individual one plane pair thin-film structures as modules is illustrated in FIG. 4. One module, identical to that shown in FIG. 3, is shown at 101. A similar module having a different internal configuration is shown at 102. The combined structure is a two plane pair thin-film structure ("2PP") 104. This is the simplest case of the multiple-plane pair thin-film structure contemplated in the present invention.

The joining pads 110 on one module, one plane pair thin-film structure 101, and the joining pads 160a on the second module, one plane pair thin-film structure 102, are specifically situated in corresponding locations. Solder is deposited on each joining pad. A spacer 195 having holes 196 through spacer 195, each hole corresponding to a pair of joining pads 110, 160a, is placed between the two modules. Under the influence of heat and pressure, the solder liquefies, forming a soldered joint 190 between each pair of joining pads 110, 160a. The preferred temperature for the soldering process is between about 150 and about 400° C. and the preferred pressure is between about 10 and about 200 psi. FIG. 4 also shows the inherent ease with which an electrical designer can place reference conducting layers operating at different potentials adjacent to each other.

Figure 5:
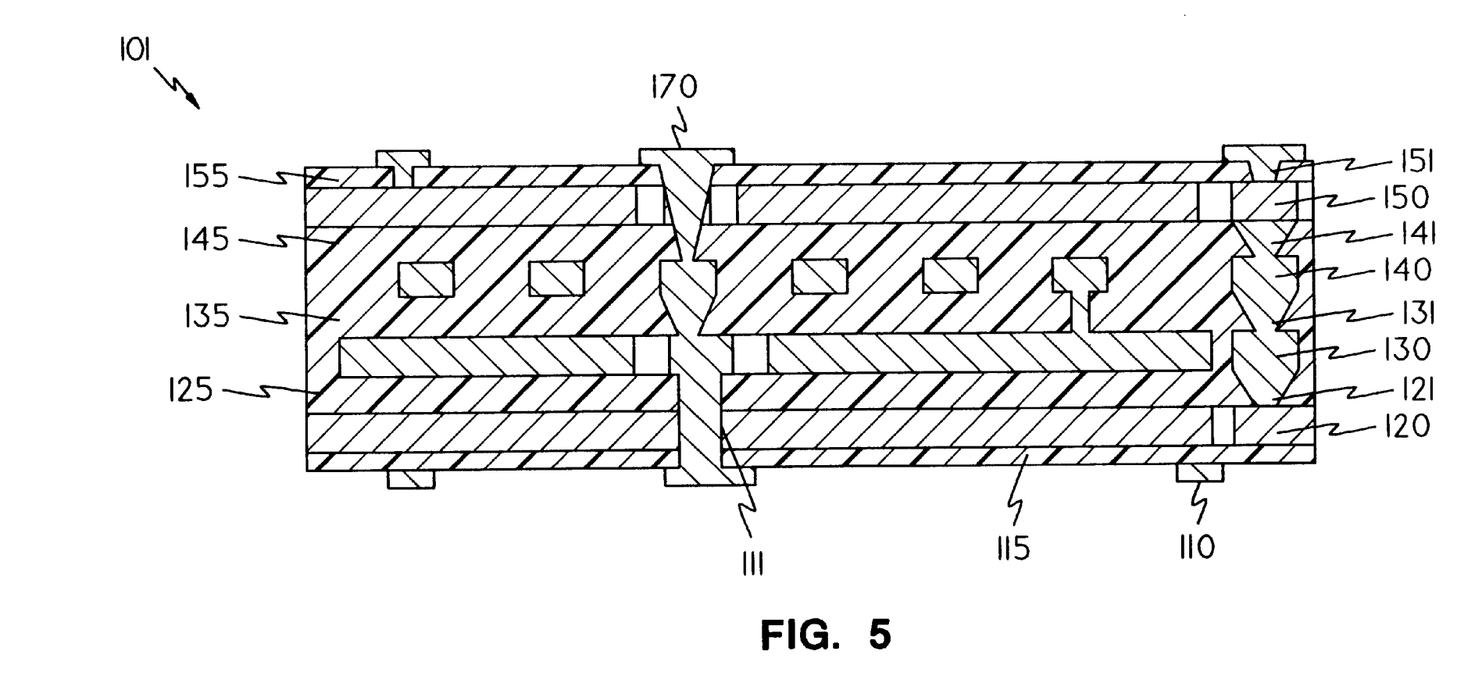
FIG. 5 illustrates, in schematic form, a cross section through a plane pair thin-film structure of the present invention, emphasizing the joining pads for connecting the structure to other objects, such as silicon chips.

FIG. 5 illustrates the top surface metallization (TSM) or terminal metal 170 incorporated in plane pair thin-film structure 101. Terminal metal 170 joins two plane pair thin-film structure 104 to one or more silicon LSI devices, or to some other components of a computer system.

Figure 6:
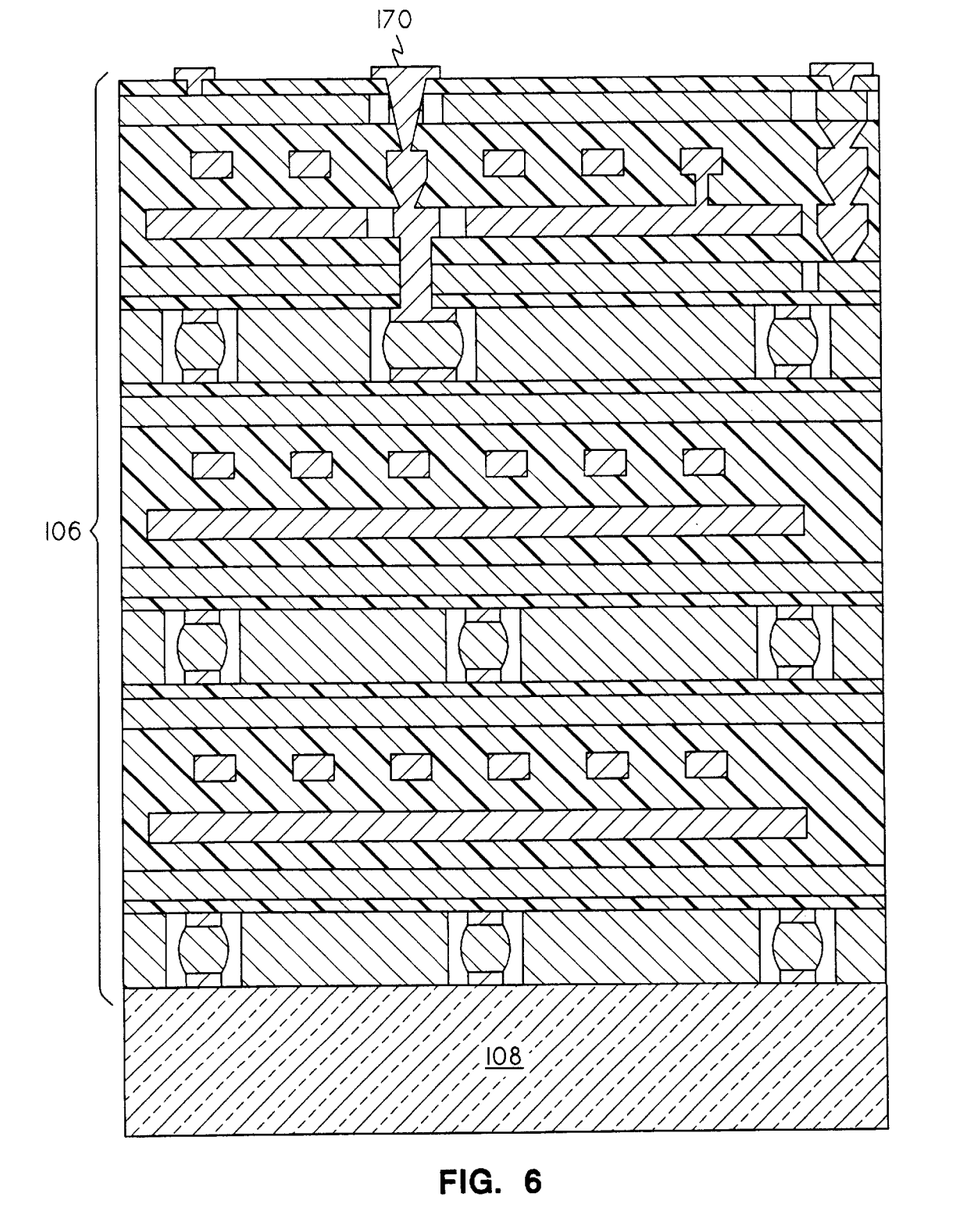
FIG. 6 illustrates, in schematic form, a cross section through a three plane pair thin-film structure of the present invention, showing the joining of such structure to a ceramic or organic carrier.

The soldered two plane pair thin-film structure 104 consisting of modules of one plane pair thin-film structures 101 and 102 is tested again for conformity to physical, dimensional, and electrical specifications before being released for further manufacturing operations. If appropriate to the design of the LSI device, additional modules could be joined to this subassembly, as illustrated in FIG. 6. FIG. 6 specifically illustrates the joining of a three plane pair thin-film structure 106 to a ceramic or organic carrier 108.

After each joining operation, the resulting assembly is preferably tested once again for conformity to physical, dimensional, and electrical specifications before being released for further manufacturing operations.

Although the preferred sequence of manufacturing operations for a particular product can be determined only after due consideration of the specific needs of that product and the peculiarities of available manufacturing facilities, a preferred method of fabrication and soldering will now be described. In an especially preferred embodiment of the present invention, a first, modular, one plane pair thin-film structure such as structure 101, is fabricated on a glass carrier, and tested for conformity to specifications. A second, modular, one plane pair thin-film structure such as structure 102, is fabricated concurrently on another glass carrier, and tested for conformity to specifications. The two modules are soldered together, using any appropriate soldering method.

One glass carrier is removed from the assembly by laser ablation. The process disclosed in U.S. Pat. No. 5,534,094 can be applied to effect such removal. The assembly is then tested for conformity to specifications. The free surface of the assembly is then joined to a suitable permanent substrate. The second glass carrier is then removed by laser ablation. In this and other embodiments of the present invention, economies of manufacture are achieved through concurrent processing of the various modules used in the multiple-plane pair thin-film structure, and testing each such module before assembly, so that only modules known to be acceptable are carried forward in the production process. Because subsequent manufacturing operations represent a low risk of producing defective parts, defective components are identified and scrapped (or reworked) early in the manufacturing process when they represent a minimum investment of time and money. This advantage represents a significant improvement over the conventional apparatus and process of manufacture represented in FIG. 2.

The following represents a preferred process of fabricating individual one plane pair structures. This process comprises thin film transfer and joining technology that reduces distortion, stress, variations in surface topography, and potential damage to the thin film, while at the same time increasing the active joining area of the thin film. The essential step of this process is that two sacrificial carrier substrates are used, and the thin-film structure is thus supported by at least one such substrate during all steps of the manufacturing process. The preferred process provides high-performance plane pair structures at a low risk of damage during manufacture and subsequent processing to fabricate multiple-plane pair thin-film structures.

Figure 7A:
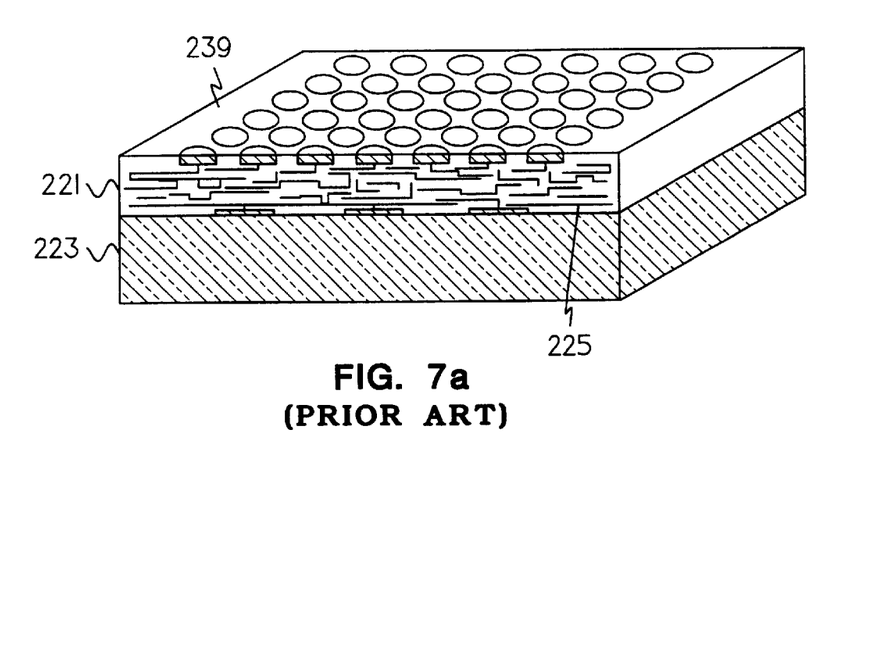
FIGS. 7a and 7b are partial schematic views of conventional processing steps for a thin film and carrier, comprising a plane pair structure.

The process for creating individual plane pair thin film is described with reference to FIGS. 7a through 17. FIG. 7a shows a multilayer thin film 221 built on a primary (glass) sacrificial carrier 223 according to conventional techniques. The thin film 221 is shown, in this embodiment, with the top surface metallurgy (TSM) up. A typical configuration for thin film 221 is for it to have a total thickness of about 50 microns with six layers of metal and several layers of polyimide or other organic insulator. Thin film 221 is patterned in a known manner with lines and vias 225 which are typically about 10 microns wide, and the thin film is generally provided with various test and repair structures. The thin film 221 has a top surface 239.

Figure 7B:
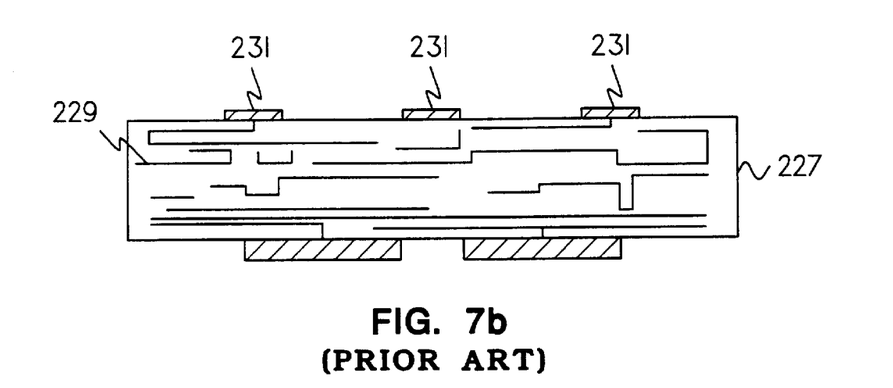
Figure 8:
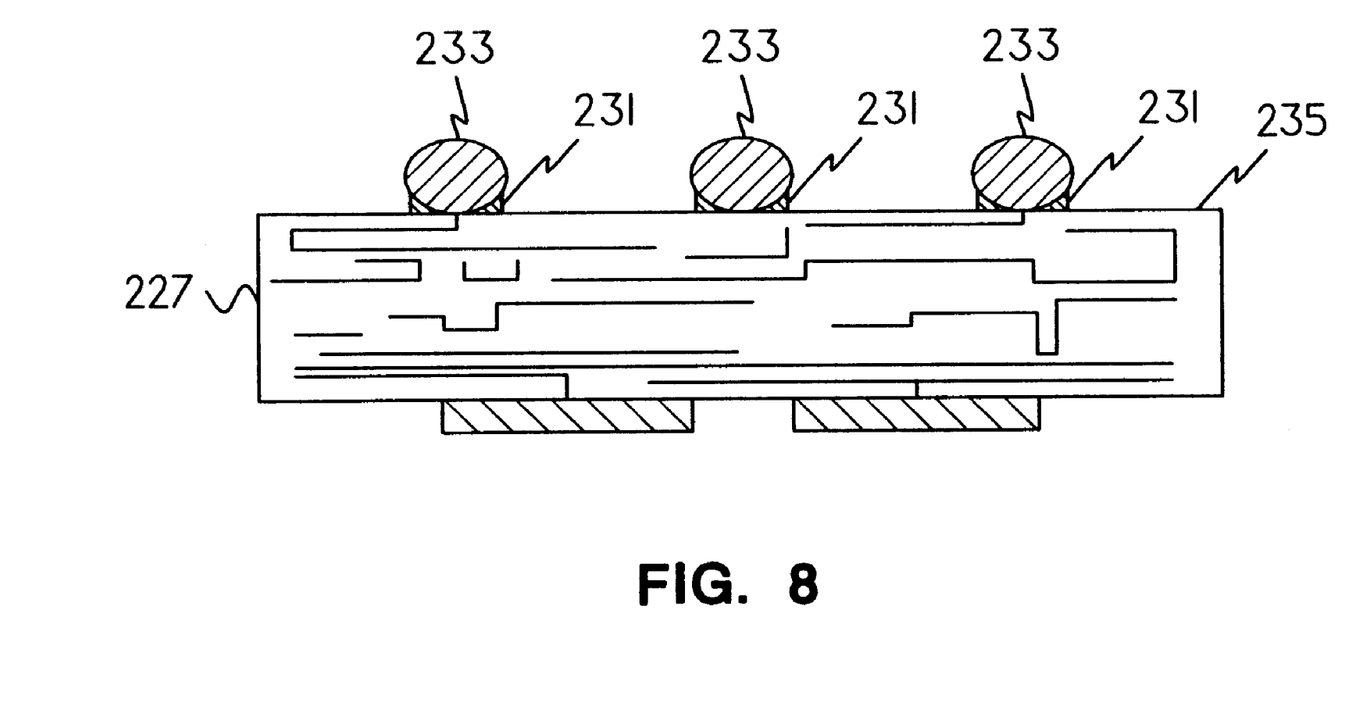
FIGS. 8, 9, and 10 are schematic perspective views representing the preferred process incorporated in the present invention.

FIG. 7b shows a typical multilayer ceramic (MLC) carrier 227 patterned with appropriate lines and vias 229 and surface metallurgy including contacts 231. To distinguish carrier 227 from first and second sacrificial carriers used in processing thin film 221, carrier 227 will be called "destination" carrier 227. In this preferred method, solder bumps or balls 233 are applied to the metallurgy or contacts 231 located at the top surface 235 of the destination carrier 227, as shown in FIG. 8.

Figure 9:
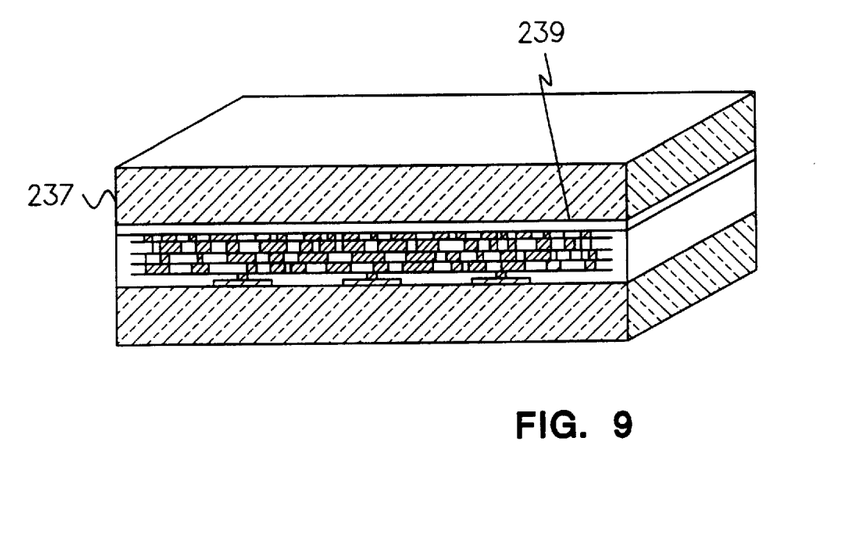

Referring now to FIG. 9, an important aspect of the preferred process is the step of securing a second sacrificial carrier 237 to the surface of the thin-film structure opposite first sacrificial carrier 223. In this case, second sacrificial carrier 237 is secured to top surface 239 of thin film 221. Second sacrificial carrier 237 is preferably a glass that is transparent to laser, having a thickness of one to five millimeters.

Figure 10:
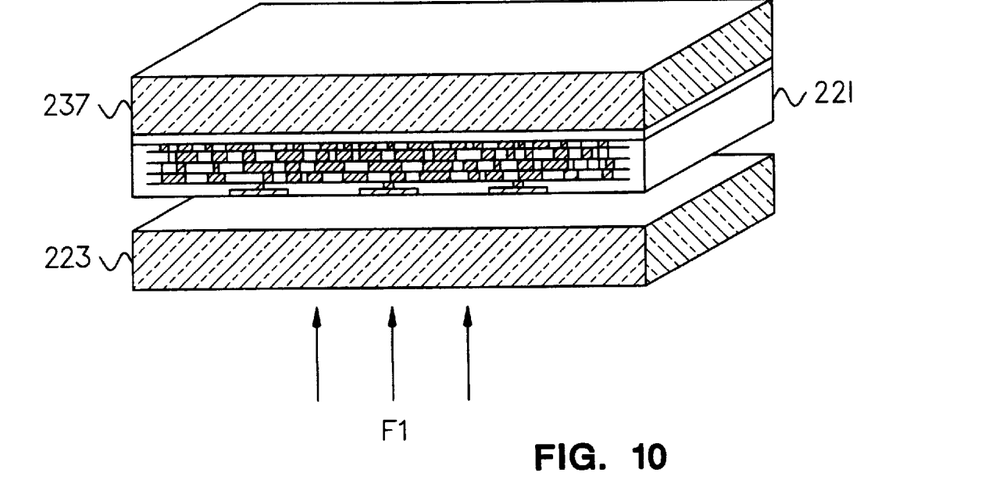

Referring to FIG. 10, the thin film 221 is released from primary sacrificial carrier 223 using an ultraviolet laser (see arrows F1) in a manner known in the art. After release of primary sacrificial carrier 223, thin film 221 remains rigidly backed by second sacrificial carrier 237. Bottom surface 241 of thin film 221 can be processed while thin film 221 remains flat and rigidly supported, and all further processing of thin film 221, including cleaning and testing, can be accomplished while avoiding free-standing moments on thin film 221. The rigid backing allows thin film 221 to be maintained substantially distortion-free, thereby reducing the risk of damage during cleaning, testing, and other processing, relative to the risk of damage that might occur if thin film 221 were processed in free-standing form.

Figure 11:
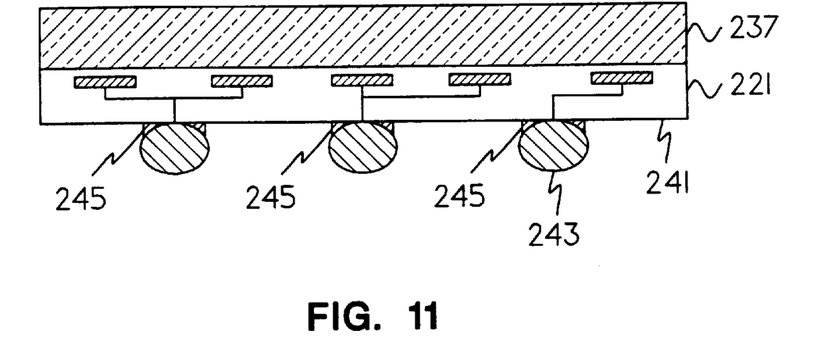
FIGS. 11 through 17 are side-elevation, partial schematic views of the preferred process incorporated in the present invention, with FIG. 17 showing the completed plane pair structure.
Figure 16:
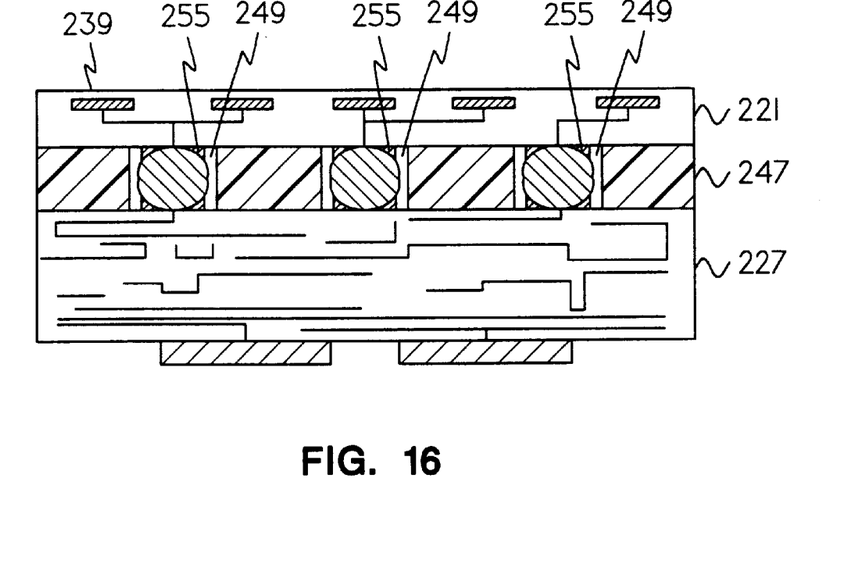

Referring now to FIG. 11, one of the processing steps comprises applying solder bumps 243 to metallic pads 245 formed on bottom surface 241 of thin film 221. Solder bumps 243 are preferably formed by paste screening in glass molds. Soldering flux may be used in forming solder bumps 243 on corresponding metallic pads 245, and a similar process may be used to form solder balls 233 on contacts 231 on destination carrier 227. The soldering flux is removed, and the solder bumps are cleaned. Solder bumps 243 on thin film 221 are joined with corresponding solder balls 233 on top mating surface 235 of destination carrier 227 in a closed solder joining process, thereby forming closed solder connections 255 (FIG. 16).

Figure 12:
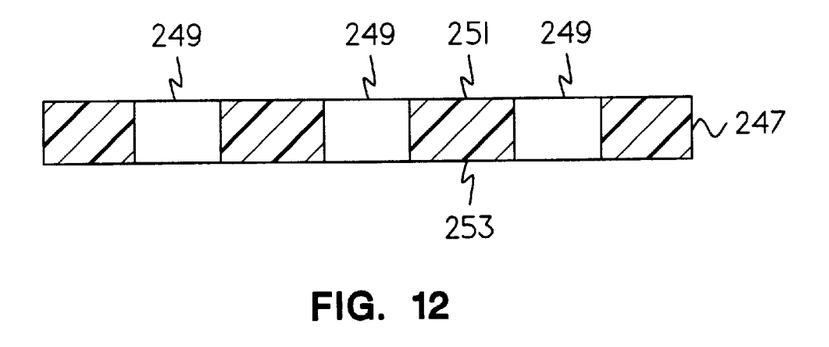

Another aspect of the preferred process is using polymeric spacer 247, as shown in FIG. 12. Spacer 247 is advantageously interposed between thin film 221 and destination carrier 227. Spacer 247 has a first surface 251 and an opposite surface 253. Through-holes or through-vias 249 extend from first surface 251 through spacer 247 to opposite surface 253, and are defined in a pattern corresponding to opposing solder balls 233 and bumps 243. Thus, through-vias 249 align and channel the resulting solder connections 255 between mating surfaces of thin film 221 and destination carrier 227. Spacer 247 is relatively thick compared to thin film 221; spacer 247 ranges between about 2.5 and about 25 microns in thickness, with about 7.5 microns being preferable.

Figure 13:
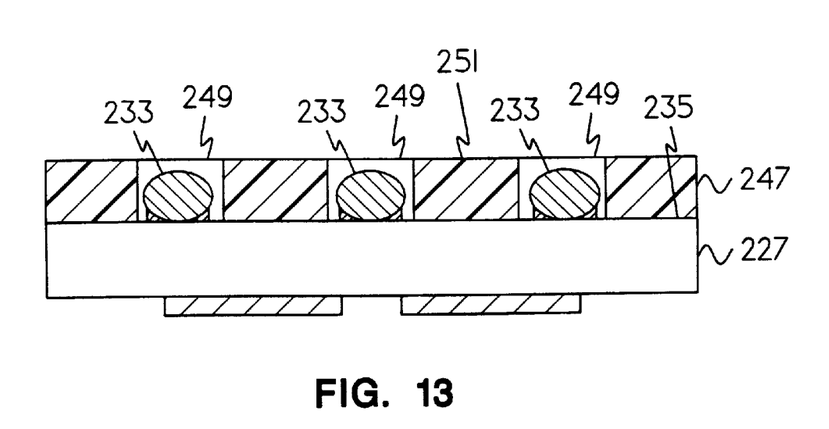

Referring now to FIG. 13, spacer 247 is placed upon top surface 235 in such a way that the through-vias 249 register with protruding solder balls 233. The spacer 247 may be adhered to the corresponding mating surfaces of thin film 221 and destination carrier 227, or not. In any case, solder balls 233 act as registration guides for the placement of spacer 247 on destination carrier 227.

Figure 14:
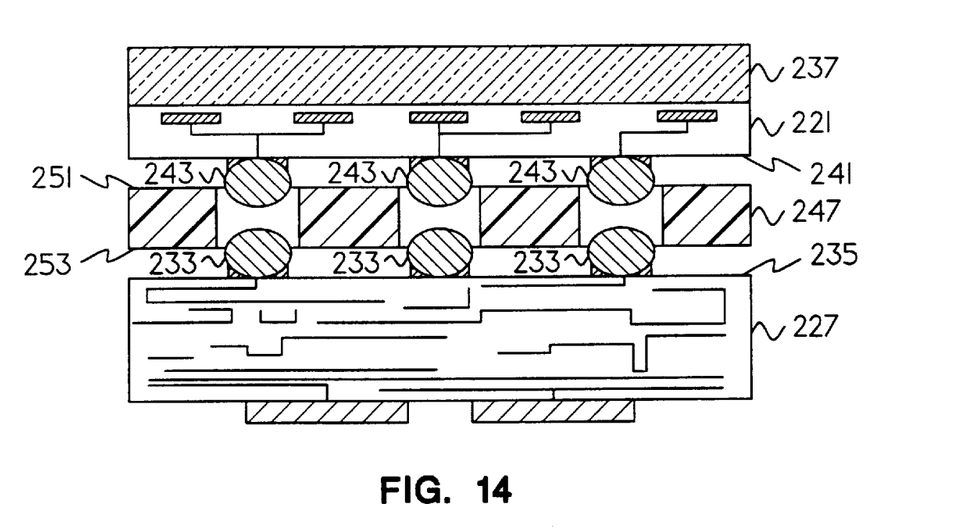

Referring now to FIG. 14, second sacrificial carrier 237 and thin film 221 mounted to it have been inverted and positioned such that solder bumps 243 register with through-vias 249. Thus, solder bumps 243 extend partially into through-vias 249 from the first surface 251 of spacer 247, while solder balls 233 extend partially into through-vias 249 from opposite surface 253 of spacer 247. Opposing pairs of solder bumps are thus formed in through-vias 249.

Figure 15:
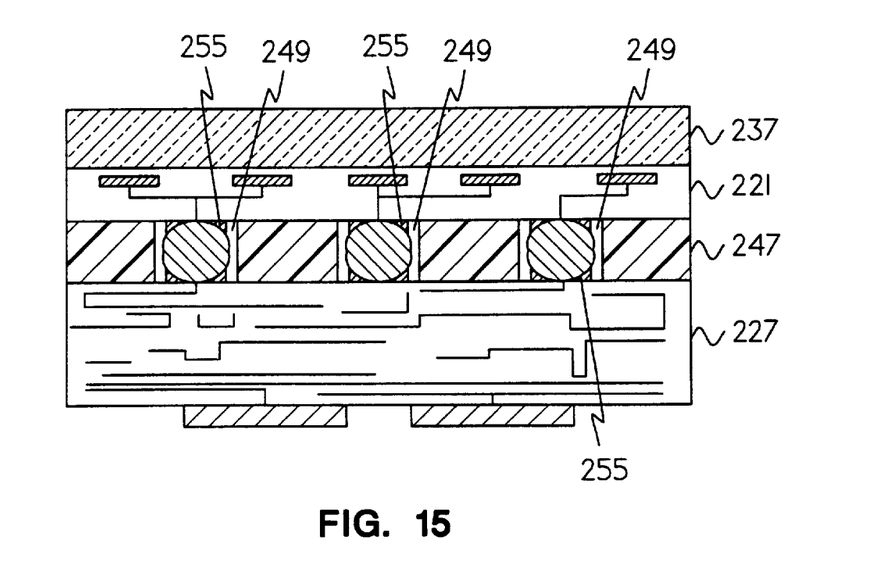

Referring now to FIG. 15, second sacrificial carrier 237 and thin film 221 are joined by closed solder joining methods to destination carrier 227, and are electronically interconnected by the resulting solder connections 255. In particular, although flux is advantageously used for solder-to-metal joining while applying solder balls 233 and bumps 243 to the corresponding surface metallurgy, solder balls 233 and bumps 243 may be joined in this aspect of the process without flux. This is desirable, for it would be difficult to remove flux from the joint areas after closed solder joining.

The foregoing description refers to a solder-to-solder joining technique, also described as a closed solder technique. Solder balls 233 are joined to corresponding solder bumps 243 in respective through-vias 249 in spacer 247. The solder reflows during this joining operation, thus establishing solder connections 255 within designated through-vias 249 in spacer 247 and thereby creating the required reliable electrical connection. A single reflow run accomplishes adhesion between spacer 247 and both destination carrier 227 and thin film 221.

Figure 17:
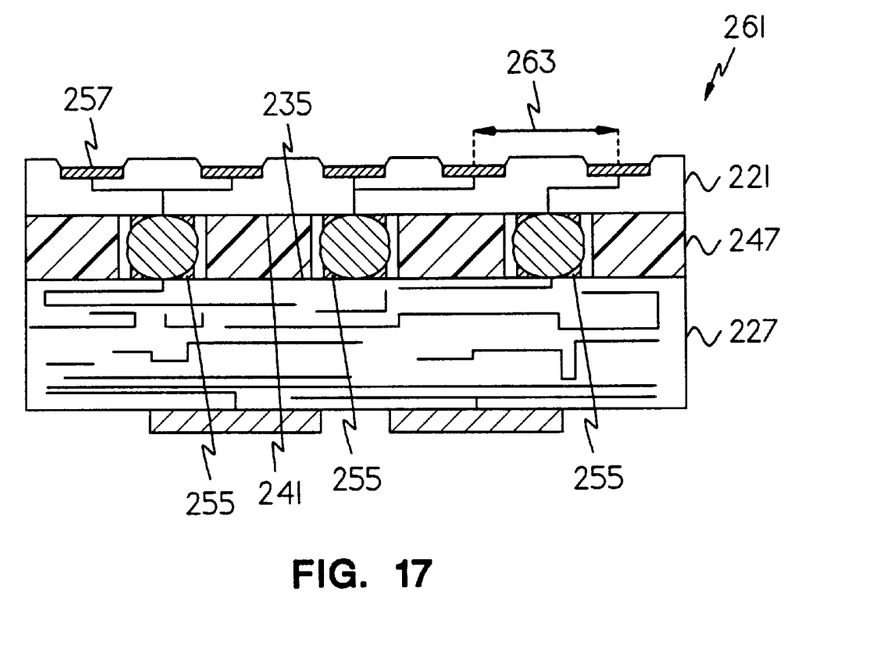

Once the closed solder joining process is complete, second sacrificial carrier 237 is laser-released from top surface 239 of thin film 221, leaving the structure shown in FIG. 16. Top surface 235 is then further ablated to expose chip joining pad surfaces 257. FIG. 17 shows the resulting high-performance structure 261 for mounting electronic devices (not shown) on structure 261. The resulting structure may be subsequently joined to other electronic devices, which technology is known in the art, or joined to other plane pair structure(s) to form the multiple-plane pair structure of the present invention.

The advantageous features of structure 261 will now be further described. Thin film 221 has more usable area (greater than 300 mm by 300 mm) available by virtue of having been rigidly backed by second sacrificial carrier 237 during its processing, rather than having its edges retained by a ring as is typical in the prior art. The rigid backing also minimizes shrinkage and distortion, allowing tighter active via pitch 263 of 10 microns or less and increased wiring densities. The rigid backing also planarizes the thin film surfaces 239 and 241. Such planarization enhances the interconnection processability between chips (not shown) and destination carrier 227, as well as that between thin film 221 and the destination carrier 227.

The process of manufacture according to the present invention offers several advantages over the prior art. Perhaps most important, each of the plane pair structures that will be incorporated into a multiple-plane pair structure can be completely fabricated and tested for compliance with applicable specifications before final assembly. Use of two sacrificial carriers eliminates the need for a ring that surrounds and protects the thin film during fabrication, thereby substantially increasing the physical size of the thin film (or the number of smaller thin films) that may be processed as a unit. Also, because closed solder joining is used, it is possible to avoid the costly process of gold compression bonding for joining components together, and the high pressures and temperatures customarily associated with that process.

The present invention comprehends the possibility that two or more multiple-plane pair thin-film structures could be fabricated as a single unit, and then cut apart in the final manufacturing operation. The desirability of such a process would depend upon the relative benefits obtained from economies of processing larger structure versus the need to test multiple structures in each unit, and cut out those found to be defective.

Although illustrated and described above with reference to certain specific embodiments, the present invention is nevertheless not intended to be limited to the details shown. Rather, various modifications may be made in the details within the scope and range of equivalents of the claims and without departing from the spirit of the invention.

What is claimed:

1. A multiple-plane pair thin-film structure comprising:
   a plurality of one plane pair thin-film structures each fabricated and tested individually;
   means for securing said one plane pair thin-film structures to each other; and
   means for selectively electrically interconnecting said one plane pair thin-film structures.

2. The multiple-plane pair thin-film structure as recited in claim 1, comprising two of said one plane pair thin-film structures.

3. The multiple-plane pair thin-film structure as recited in claim 1, wherein each one plane pair thin-film structure comprises:
   a first insulating layer,
   a first conducting reference plane layer,
   a second insulating layer,
   a first conducting signal layer,
   a third insulating layer,
   a second conducting signal layer,
   a fourth insulating layer,
   a second conducting reference plane layer,
   a fifth insulating layer, and
   a plurality of vias that interconnect one conducting layer to another conducting layer, thus piercing an intervening insulating layer.

4. The multiple-plane pair thin-film structure as recited in claim 3, further comprising at least one joining pad connected to said first conducting reference plane layer and extending through a corresponding hole in said first insulating layer.

5. The multiple-plane pair thin-film structure as recited in claim 3, further comprising at least one joining pad connected to said second conducting reference plane layer and extending through a corresponding hole in said fifth insulating layer.

6. The multiple-plane pair thin-film structure as recited in claim 5, wherein the means for securing said one plane pair thin-film structures to each other comprises solder applied to at least one joining pad on said first plane pair thin-film structure and to at least one joining pad on said second plane pair thin-film structure.

7. The multiple-plane pair thin-film structure as recited in claim 3, wherein at least one of said conducting layers and at least one of said vias consists of a metallic material.

8. The multiple-plane pair thin-film structure as recited in claim 7, wherein said metallic material is copper.

9. The multiple-plane pair thin-film structure as recited in claim 3, wherein at least one of said insulating layers consists of a polymeric material.

10. The multiple plane pair thin-film structure as recited in claim 9, wherein said polymeric material is selected from the group consisting of epoxies and polyimides.

11. A multiple plane pair thin-film structure comprising:
a plurality of one plane pair thin-film structures each fabricated and tested individually, each of said one plane pair thin-film structures including:
(a) a first insulating layer,
(b) a first conducting reference plane layer,
(c) at least one joining pad connected to said first conducting reference plane layer and extending through a corresponding hole in said first insulating layer,
(d) a second insulating layer,
(e) a first conducting signal layer,
(f) a third insulating layer,
(g) a second conducting signal layer,
(h) a fourth insulating layer,
(i) a second conducting reference plane layer,
(j) a fifth insulating layer, and
(k) a plurality of vias that interconnect one conducting layer to another conducting layer, thus piercing an intervening insulating layer;
means for securing said one plane pair thin-film structures to each other; and
means for selectively electrically interconnecting said one plane pair thin-film structures.

12. A method for manufacturing multiple plane pair thin-film structures, comprising the steps of:
a) manufacturing a plurality of one plane pair thin-film structures, each such structure having its own characteristic internal configuration and each having at least one joining pad situated to cooperate with a corresponding joining pad on another such structure;
b) testing each such one plane pair thin-film structure to ensure conformity with applicable physical, dimensional, and electrical specifications;
c) securing a first plane pair thin-film structure to a substrate; and
d) electrically joining the first plane pair thin-film structure to at least a second plane pair thin-film structure by soldering said corresponding joining pads to each other.

13. The method for manufacturing a multiple plane pair thin-film structure as recited in claim 12, comprising the additional step of securing said thin-film structures to each other by mechanical joining.

14. The method for manufacturing a multiple plane pair thin-film structure as recited in claim 12, comprising the additional step of securing said thin-film structures to each other by adhesive joining.

15. The method for manufacturing a multiple plane pair thin-film structure as recited in claim 12, wherein the steps of manufacturing and electrically joining comprise the steps of:

(a) building a multilayer thin film on a first sacrificial carrier with lines and vias patterned thereon, said thin film having opposite planar surfaces and conductive pads and a first array of electrical contacts on one of said surfaces;

(b) securing a second sacrificial carrier to the thin film opposite the first sacrificial carrier;

(c) removing said first sacrificial carrier to expose the surface of the thin film having the first array of electrical contacts and conductive pads thereon;

(d) forming solder bumps on the conductive pads of said exposed surface;

(e) providing a destination carrier with a second array of electrical contacts corresponding to said first array, the second array having solder bumps thereon;

(f) providing a spacer of compliant, nonconductive material, the spacer having opposite planar surfaces;

(g) creating a pattern of through-vias extending between the opposite planar surfaces, the pattern of through-vias corresponding to said arrays of electrical contacts;

(h) positioning said spacer so that one of said planar surfaces of said spacer opposes one of said exposed surfaces of said thin film and said destination carrier surface;

(i) aligning said pattern of through-vias with said corresponding array of electrical contacts, the electrical contacts serving as registration guides for proper placement of the spacer;

(j) positioning the other of said planar surfaces of said spacer so that it opposes the other one of said exposed surface of said thin film and said destination carrier surface;

(k) aligning said solder bumps of said thin film with corresponding solder bumps of said destination carrier to form a plurality of opposing solder bump pairs;

(l) applying heat greater than about 150° C. but less than about 400° C. to the solder bumps and inward pressure less than about 200 psi to the solder bumps in a closed solder joint process, thereby causing opposing pairs of the solder bumps to form solder connections between said thin film and a substrate adjacent thereto; and (m) removing said second sacrificial carrier by means of a laser after forming said solder connections, whereby said thin film is bonded and electrically connected to said substrate to form at least a component of a multilayer thin-film structure.

* * * * *